United States Patent [19]

Ogawa et al.

[11] Patent Number: 5,077,912

[45] Date of Patent: Jan. 7, 1992

[54] PROCESS FOR DRYING COATED WEB

[75] Inventors: Masaharu Ogawa; Tatsuya Hamanaka, both of Shizuoka, Japan

[73] Assignee: Fuji Photo Film Co., Ltd., Kanagawa, Japan

[21] Appl. No.: 433,270

[22] Filed: Nov. 8, 1989

[30] Foreign Application Priority Data

Nov. 9, 1988 [JP] Japan .................. 63-281408

[51] Int. Cl.$^5$ .................. F26B 7/00
[52] U.S. Cl. .................. 34/23; 34/41; 427/379
[58] Field of Search .................. 34/23, 41, 155, 156, 34/18, 68; 118/61, 60, 325, 58, 59; 427/331, 327, 348, 372.2, 379, 383.1

[56] References Cited

U.S. PATENT DOCUMENTS

| | | | |
|---|---|---|---|
| 2,270,038 | 1/1942 | Corbin | 118/642 X |
| 3,281,952 | 11/1966 | Mullaney | 34/41 |
| 3,877,418 | 4/1975 | Shaner | 118/642 |
| 4,567,673 | 2/1986 | Bohnensieker | 118/60 X |
| 4,894,927 | 1/1990 | Owaga et al. | |
| 4,926,567 | 5/1990 | Ogawa | |

FOREIGN PATENT DOCUMENTS 60-149871 8/1985 Japan .

*Primary Examiner*—Henry A. Bennet
*Attorney, Agent, or Firm*—Burns, Doane, Swecker & Mathis

[57] ABSTRACT

A process for drying a coated web which comprises drying a continuously traveling web coated with a coating composition containing an organic solvent by hot air up to set to touch, and evaporating the residual solvent in the coated membrane by heating a heating roll. In the process of the invention, since a coated web is first dried by a hot air at a relatively low temperature, such as lower than 150° C., up to set to touch state and then further dried by a heating roll being excellent in heat conductivity, a temperature distribution occurs little in the cross direction. Moreover, the present drying process rarely affects adversely the coated membrane of the web.

4 Claims, 1 Drawing Sheet

PROCESS FOR DRYING COATED WEB

BACKGROUND OF THE INVENTION

1. Field of the Invention

This invention relates to an improvement in a process for drying a coated web, such as a drying process during manufacturing a photographic photosensitive material by applying a coating composition onto a metal support and then drying.

2. Description of the Prior Art

Various photographic photosensitive materials and other materials are manufactured by drying a continuous web such as a metal support, a plastic support or a paper support on which one or more coating compositions are applied. This composition is generally produced by dissolving or dispersing prescribed components in an organic solvent. The coated web is dried by blowing hot air or irradiation of infrared light. It is also known that the coated web is dried by the radiant heat from heating plates disposed on the upper side and lower side of the web (Japanese Patent KOKAI No. 60-149871).

Incidentally, in the manufacturing process of photographic photosensitive materials, since it is advantageous to apply the coating composition continuously, strips having a limited length were successively joined and supplied to the applying portion without the interruption of the applying work. However, in the case that the heat capacity of the web was great, it was recognized to generate a temperature difference in the web according to the difference in the thickness (the difference in the heat capacity), since the temperature of the web at the exit of the drying apparatus did not reach an equilibrium with temperature of drying air or the like. Such a difference resulted the difference of dried degree, and affected adversely the quality of the product. Heretofore, in order to decrease the above affect, a sufficient drying equipment was provided, and thereby, the above problem was avoided. Recently, the coating speed has tended to be raised by the requirement to raise productivity. However, since there is a limit to decrease the coating amount and to densify the coating solution, the space to be occupied by the drying apparatus has tend to increase.

SUMMARY OF THE INVENTION

An object of the invention is to provide a means to dry a coated web such as a photographic photosensitive material in the manufacturing process thereof rapidly without requiring a board space.

The present invention provides a means which has achieved the above object, and characterized by combining a hot air drying and a heating roll drying.

Thus, the process for drying a coated web of the invention comprises drying a continuously traveling web coated with a coating composition containing an organic solvent by hot air up to set to touch, and evaporating the residual solvent in the coated membrane by heating a heating roll.

DETAILED DESCRIPTION OF THE INVENTION

The hot air drying is incorporated in order to dry the coated web up to set to tough, and it is sufficient that the drying conditions, such as the temperature of the hot air and the wind velocity, are adjusted so as to obtain the set to touch. The set to touch means the state where the coated membrane has a viscosity of $10^8$ to $10^{10}$ poise and becomes not to adhere to a finger.

The heating roll drying is incorporated in order to evaporate the residual solvent in the coated membrane after the hot air drying to dry it up to a prescribed state. The heating roll may be any one capable of drying a web by heat transfer, and the heating medium may be water vapor, heated oil, hot water or the like.

The web applicable to the invention may be any one composed of various supports coated with a coating composition where necessary components are dissolved or suspended in an organic solvent according to its use. The organic solvent is selected according to the components to be dissolved or suspended, and includes benzene, toluene, ethyl acetate, methyl propyl ketone, methyl acetate, methylene glycol and the like.

In the process of the invention, since a coated web is first dried by a hot air at a relatively low temperature, such as lower than 150° C., up to set to touch state and then further dried by a heating roll being excellent in heat conductivity, a temperature distribution occurs little in the cross direction. Moreover, the present drying process rarely affects adversely the coated membrane of the web such as fogging or the reduction of membrane strength. The drying capacity is sharply improved, and the drying time can be shortened. Therefore, the space for drying apparatus can be decreased, and the coating speed can be elevated. Since the heat conductivity of the heating roll is great, the difference in the thickness of webs and the difference in the quality in the cross direction can be minimized.

EXAMPLES

Figure 1:
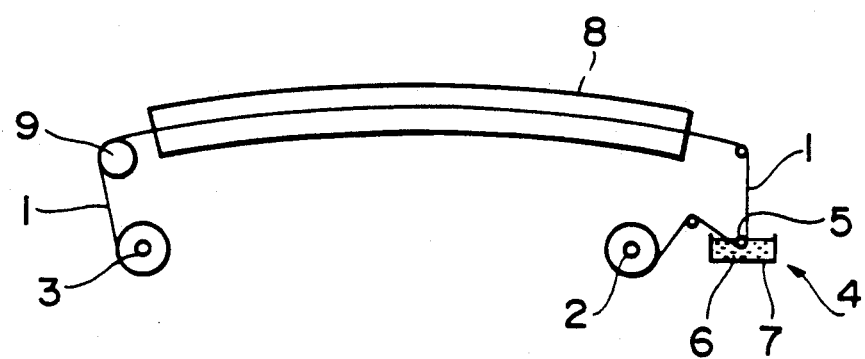
FIG. 1 is a schematic illustration of an apparatus used for the process of the invention.
Figure 2:
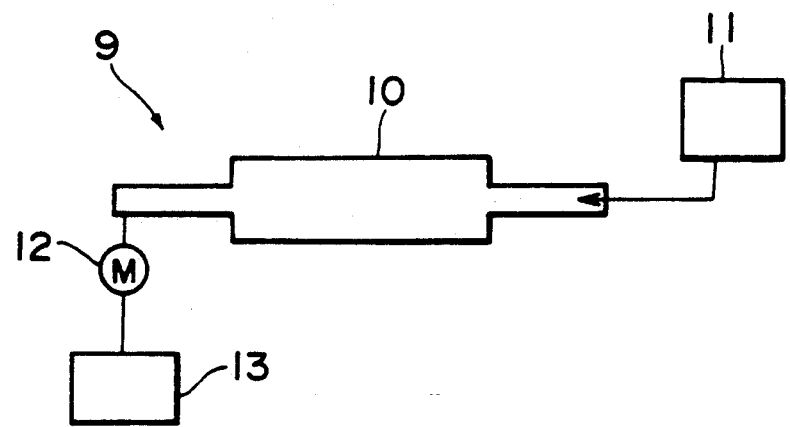
FIG. 2 is a schematic illustration of a heating roll drying apparatus.

An apparatus used for the process of the invention is illustrated in FIG. 1. As shown in the figure, a web 1 is coiled around a roll 2 and unwound therefrom. A coating apparatus 4 is composed of a coating roller 5 and vessel 7 for placing a coating composition 6, and provided in the vicinity of the roll 2. The drying apparatus is composed of a hot air drying apparatus 8 and a heating roll drying apparatus 9. As illustrated in FIG. 2, the principal member of the heating roll drying apparatus 9 is a metal roll 10 to touch the web 1. The metal roll 10 connects a heating medium supply 11 supplying water vapor. The heating roll drying apparatus 9 is provided with a motor 12 and its controller 13. The dried web 1 is taken up by a take-up roll 3.

In the above apparatus, the web 1 is unwound from the roll 2, and coated with the coating composition 6 at the coating apparatus 4. The web 1 then enters in the hot air drying apparatus 8, and blown by the hot air adjusted to 50 to 150° C. at a wind velocity of 3 to 30 m/sec. The solvent contained in the coated web 1 is gradually evaporated in the drying apparatus 8, and reaches a set to touch state at the exit. The web 1 further travels, and is dried completely by the heating roll drying apparatus 9. Then, the dried web 1 is wound around the take up roll 3.

Using the above apparatus, an aluminum web 200 μm in thickness was coated with a coating composition having a viscosity of 30 cp composed of 15.0 parts by weight of phenol resin, 74.7 parts by weight of ethyl acetate, 10.0 parts by weight of methyl propyl ketone and 0.3 parts by weight of fluorine surfactant at a coating amount of 25 cc/m$^2$.

First, the aluminum web was coated by a conventional method. The drying apparatus employed was an arch dryer of slit blowoff type 30 m in length, and the drying conditions were a hot air temperature of 110° C., a wind velocity of 12 m/sec. and a traveling speed (coating speed) of the aluminum web of 50 m/min. As a result, the coated web reached a set to touch state at a distance of 18 m from the entrance, but all of the residual solvent was evaporated scarcely at the exit. Therefore, the coating speed could not be elevated moreover.

Subsequently, a heating roll 80 cm in diameter was set on the exit side of the above arch dryer, the coated aluminum web was dried at a hot air temperature of 110° C., a wind velosity of 12 m/sec., a heating roll temperature of 115° C. and a coating speed of 70 m/min. In this case, the coated web reached a set to touch state at a distance of 25 m from the entrance, and the residual solvent was completely evaporated by the heating roll.

No longitudinal streak nor abrasion occurred in the web by passing through the heating roll. Moreover, the photographic properties of the web were evaluated, and found to be the same as those obtained by the conventional process.

We claim:

1. A process for drying a coated metal web which comprises drying a continuously traveling metal web coated with a coating composition containing an organic solvent by hot air up to set to touch, and evaporating the residual solvent in the coated membrane by heating the web with a heating roll.

2. The process of claim 1 wherein said set to touch is a state where the coated coating composition has a viscosity of $10^8$ to $10^{10}$ poise.

3. The process of claim 1 wherein said organic solvent is a member selected from the group consisting of benzene, toluene, ethyl acetate, methyl propyl ketone, methyl acetate and methylene glycol 4. The process of claim 1 wherein the temperature of said hot air is in the range of 50 to 150° C.

* * * * *